United States Patent
Jensen et al.

(10) Patent No.: US 11,108,222 B2
(45) Date of Patent: Aug. 31, 2021

(54) MONITOR DEVICE, GROUND FAULT PROTECTION CIRCUIT AND TECHNIQUES

(71) Applicant: Littelfuse, Inc., Chicago, IL (US)

(72) Inventors: Kristophor Jensen, Chicago, IL (US); Kip M. Larson, Rapid City, SD (US); Cornelis Verhey, Chicago, IL (US)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 16/297,487

(22) Filed: Mar. 8, 2019

(65) Prior Publication Data

US 2019/0288499 A1  Sep. 19, 2019

Related U.S. Application Data (60) Provisional application No. 62/644,359, filed on Mar. 16, 2018.

(51) Int. Cl.
*G01R 31/50* (2020.01)
*H02H 1/00* (2006.01)
*H02H 9/08* (2006.01)

(52) U.S. Cl.
CPC ............ *H02H 1/003* (2013.01); *G01R 31/50* (2020.01); *H02H 9/08* (2013.01)

(58) Field of Classification Search
CPC .. G01R 31/50–62; H02H 1/003; H02H 5/105; H02H 3/331
See application file for complete search history.

(56) References Cited

U.S. PATENT DOCUMENTS

| | | | |
|---|---|---|---|
| 3,848,159 A * | 11/1974 | Nye, Jr. | H02H 3/33 361/45 |
| 5,508,620 A | 4/1996 | Pfiffner | |
| 7,180,300 B2 * | 2/2007 | Premerlani | G01R 31/086 324/512 |
| 8,405,940 B2 | 3/2013 | Schweitzer, III et al. | |
| 9,797,939 B2 * | 10/2017 | Vangool | H02H 5/105 |

(Continued)

FOREIGN PATENT DOCUMENTS

| | | |
|---|---|---|
| DE | 2458530 A1 | 5/1976 |
| EP | 0360109 A1 | 3/1990 |

(Continued)

OTHER PUBLICATIONS

How Capacitors Work, National MagLab, Mar. 24, 2017 (Year: 2017).*

(Continued)

*Primary Examiner* — Patrick Assouad
*Assistant Examiner* — Demetrius R Pretlow
(74) *Attorney, Agent, or Firm* — Kacvinsky Daisak Bluni PLLC (57) ABSTRACT

A neutral grounding resistor fault protection arrangement. The fault protection arrangement may include a neutral grounding resistor, the neutral grounding resistor comprising a ground end and a non-ground end; a sense circuit, coupled to the non-ground end of the neutral grounding resistor; and a neutral grounding monitor, coupled to the non-ground end of the neutral grounding resistor, the neutral grounding monitor comprising an injection signal generator, the injection signal generator arranged to generate a frequency of 240 Hz or greater.

16 Claims, 10 Drawing Sheets

(56) References Cited

U.S. PATENT DOCUMENTS

| | | | |
|---|---|---|---|
| 2002/0024342 A1* | 2/2002 | Bussinger | G01R 31/083 324/541 |
| 2004/0130326 A1* | 7/2004 | Yamamoto | B60L 3/0069 324/503 |
| 2007/0176604 A1* | 8/2007 | Morimoto | B60L 3/0069 324/525 |
| 2009/0278547 A1* | 11/2009 | Acena | G01R 31/52 324/509 |
| 2012/0014020 A1* | 1/2012 | Lehmann | G01R 31/50 361/42 |
| 2012/0194200 A1 | 8/2012 | McDiarmid et al. | |
| 2013/0328405 A1* | 12/2013 | Bai | G01R 31/40 307/80 |
| 2014/0153142 A1 | 6/2014 | Callsen | |
| 2014/0176163 A1* | 6/2014 | Ripoll | G01N 27/04 324/705 |
| 2015/0048840 A1* | 2/2015 | Vangool | G01R 31/50 324/509 |
| 2015/0168476 A1* | 6/2015 | Park | G01R 31/50 324/549 |
| 2015/0346262 A1* | 12/2015 | Curtis | G01R 31/50 324/509 |
| 2015/0346263 A1* | 12/2015 | Curtis | G01R 31/50 324/509 |
| 2015/0346264 A1* | 12/2015 | Curtis | H02H 5/105 324/509 |
| 2016/0061879 A1* | 3/2016 | Dougherty | H02H 7/22 361/93.2 |
| 2016/0124038 A1* | 5/2016 | Matsushita | G01R 31/50 324/510 |
| 2016/0134105 A1* | 5/2016 | Harris | G01R 31/50 361/91.1 |
| 2017/0138991 A1* | 5/2017 | Curtis | H01H 47/00 |
| 2019/0219620 A1* | 7/2019 | Kim | G01R 15/18 |
| 2019/0377022 A1* | 12/2019 | Guo | G01R 27/18 |

FOREIGN PATENT DOCUMENTS

| | | |
|---|---|---|
| EP | 2772770 A1 | 9/2014 |
| JP | 2002131361 A | 5/2002 |

OTHER PUBLICATIONS

European Search Report for the European Patent Application No. EP19163284, dated Aug. 14, 2019, 2 pages.
European Search Report for the European Patent Application No. EP19163281, dated Aug. 14, 2019, 2 pages.

* cited by examiner

POWER SYSTEM IS CONNECTED TO FAULT PROTECTION ARRANGEMENT
1002

RESISTANCE OF NEUTRAL GROUNDING RESISTOR IS PROBED BY SENDING INJECTION SIGNAL FROM SENSE CIRCUIT
1004

ALARM SIGNAL IS GENERATED WHEN RESISTANCE OF NEUTRAL GROUNDING RESISTOR FALLS OUTSIDE OF PREDETERMINED RANGE.
1006

FIG. 10

MONITOR DEVICE, GROUND FAULT PROTECTION CIRCUIT AND TECHNIQUES

RELATED APPLICATIONS

This Application claims priority to U.S. Provisional Patent Application No. 62/644,359, filed Mar. 16, 2018, entitled MONITOR DEVICE, GROUND FAULT PROTECTION CIRCUIT AND TECHNIQUES, and incorporated by reference herein in its entirety.

BACKGROUND

Field

Embodiments relate to the field of protection devices, an in particular, to neutral grounding resistors.

Discussion of Related Art

Ground fault resistors, or neutral grounding resistors, may be used in conjunction with resistance grounded power systems. A neutral grounding resistor may be deployed under conditions where a ground fault is to be limited to a predetermined current. Neutral grounding resistors may also be accompanied by a monitor to monitor when degradation of neutral grounding resistor may take place. In some jurisdictions, monitoring of neutral grounding resistors is required during all operation phases for changes in resistance value.

In view of the above, the present embodiments are provided.

BRIEF SUMMARY

In one embodiment, a fault protection arrangement may include a neutral grounding resistor, the neutral grounding resistor comprising a ground end and a non-ground end. The arrangement may further include a sense circuit, coupled to the non-ground end of the neutral grounding resistor. The arrangement may include an injection signal generator, coupled to the non-ground end of the neutral grounding resistor, the injection signal generator arranged to generate a frequency of 240 Hz or greater.

In another embodiment, a neutral grounding resistor monitor assembly is provided. The neutral grounding resistor monitor assembly may include a sense resistor circuit, having an output, arranged to connect to a non-ground end of a neutral grounding resistor and an injection signal generator, arranged to connect to the non-ground end of the neutral grounding resistor, the injection signal generator arranged to generate an alternating current signal. The neutral grounding resistor monitor assembly may further include an injection capacitor, the injection capacitor comprising a first electrode coupled to receive a signal from the injection signal generator, and a second electrode, arranged to connect to the non-ground end of the neutral grounding resistor.

In another embodiment, a fault protection method may include connecting a power system to a fault protection arrangement. The fault protection arrangement may include a neutral grounding resistor, the neutral grounding resistor comprising a ground end and a non-ground end; a sense circuit, coupled to the non-ground end of the neutral grounding resistor, the sense circuit comprising a sense resistor, and an injection capacitor. The fault protection arrangement may include an injection signal generator, coupled to the non-ground end of the neutral grounding resistor. The method may also include probing a resistance of the neutral grounding resistor by sending an injection signal from the sense circuit.

DESCRIPTION OF EMBODIMENTS

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

Figure 1A:
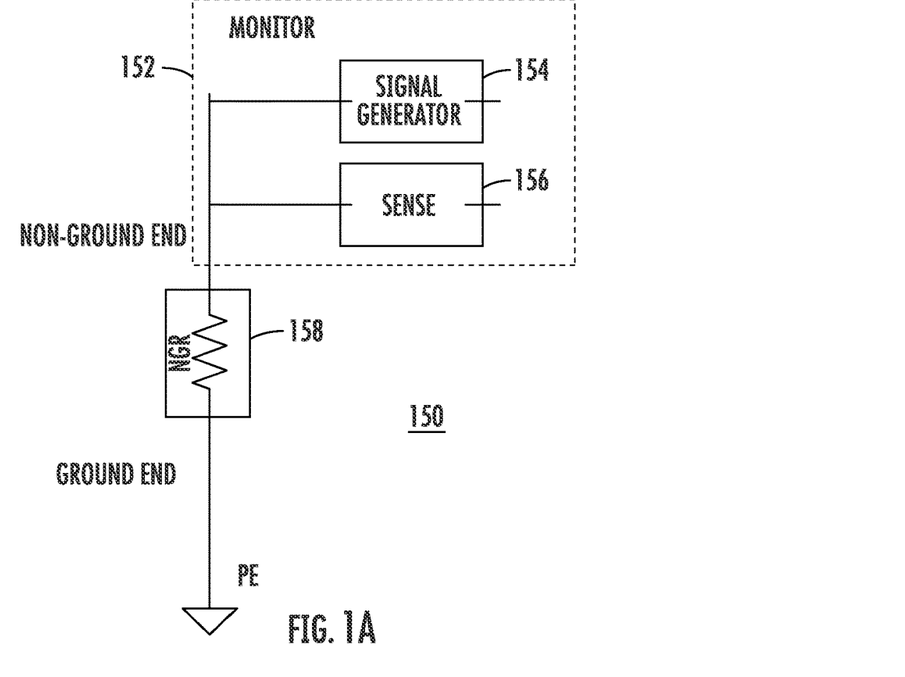
FIG. 1A shows a protection arrangement according to various embodiments of the disclosure.
Figure 1B:
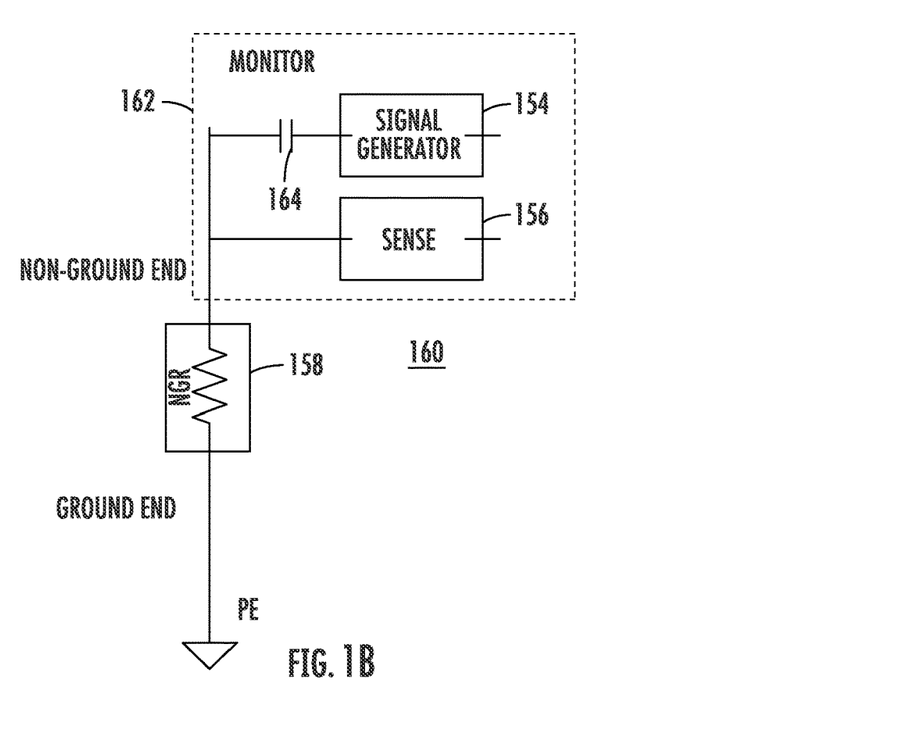
FIG. 1B shows a further protection arrangement according to various embodiments of the disclosure.
Figure 1C:
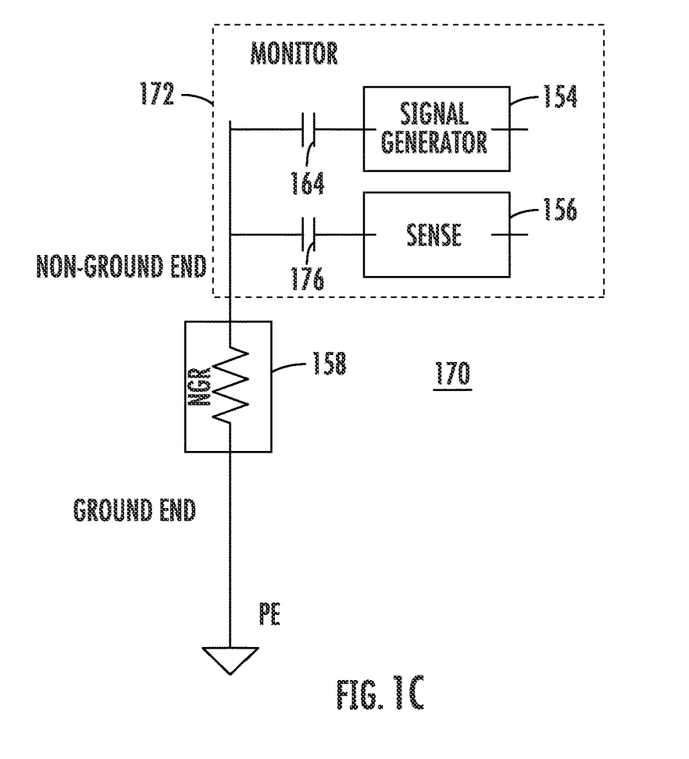
FIG. 1C shows another protection arrangement according to various embodiments of the disclosure.

In various embodiments, systems and devices are provided for providing fault protection. FIG. 1A shows a fault protection arrangement 150 according to various embodiments of the disclosure. The fault protection arrangement 150 includes a neutral grounding resistor 158, coupled on a non-ground end to a neutral grounding resistor monitor assembly 152. The neutral grounding resistor monitor assembly 152 may include a signal generator 154 and a sense circuit 156, where variants of this arrangement are described in more detail with respect to the figures to follow. FIG. 1B shows another fault protection arrangement 160 according to various embodiments of the disclosure. The fault protection arrangement 160 includes a neutral grounding resistor 158, coupled on a non-ground end to a neutral grounding resistor monitor assembly 162. The neutral grounding resistor monitor assembly 162 may include a signal generator 154 and a sense circuit 156, and a capacitor 164, disposed between the sense circuit and non-grounding end of the neutral grounding resistor 158, where variants of this arrangement are described in more detail with respect to the figures to follow. FIG. 1C shows a further fault protection arrangement 170 according to various embodiments of the disclosure. The fault protection arrangement 170 includes a neutral grounding resistor 158, coupled on a non-ground end to a neutral grounding resistor monitor assembly 172. The neutral grounding resistor monitor assembly 172 may include an injection signal generator 154 and a sense circuit 156, capacitor 164, disposed between the injection signal generator 154 and non-grounding end of the neutral grounding resistor 158, and capacitor 176, disposed between the sense circuit 156 and neutral grounding resistor 158, where variants of this arrangement are described in more detail with respect to the figures to follow.

Figure 1D:
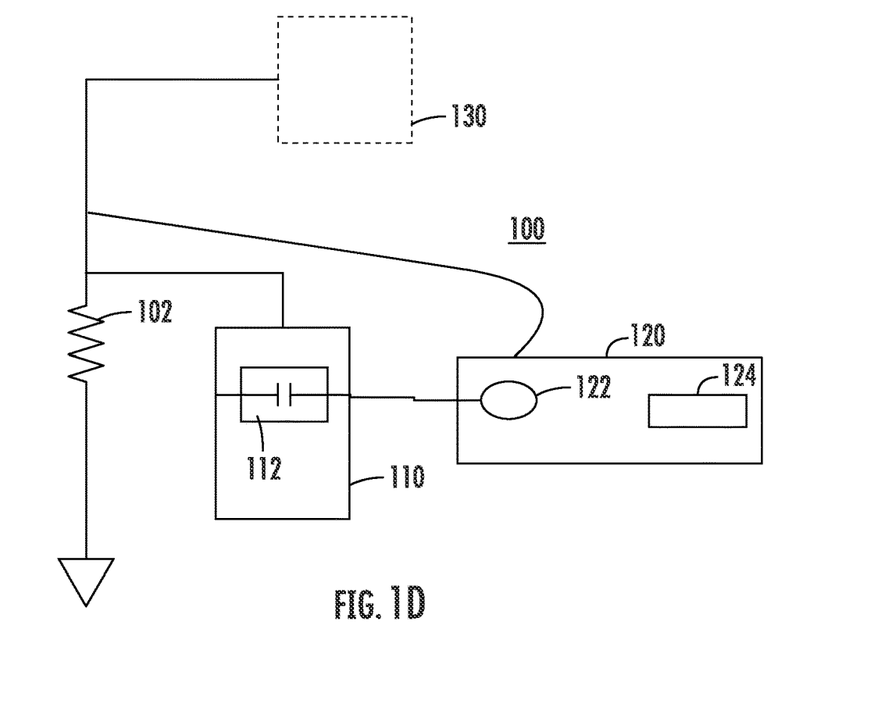
FIG. 1D shows yet another protection arrangement according to various embodiments of the disclosure.

FIG. 1D shows a fault protection arrangement 100 according to various embodiments of the disclosure. The fault protection arrangement 100 involves a neutral grounding resistor 102, electrically coupled to ground and coupled to a power system 130. The power system 130 may include various known components including transformers and other equipment. The neutral grounding resistor 102 may be designed to provide a target resistance over any suitable range, such as 10Ω to thousands of Ω. The embodiments are not limited in this context. During operation, the neutral grounding resistor 102 is designed to present a fixed electrical resistance, to treat a given fault energy received, for example, over a line between the neutral grounding resistor and power system 130. In particular, the neutral grounding resistor 102 may be coupled to the neutral of a power system to limit fault current, providing a path for grounding current to a transformer neutral. Excessive changes in the resistance value of the neutral grounding resistor 102 may cause harm to a system being protected. In accordance with embodiments of the disclosure, the fault protection arrangement 100 provides monitoring and control to determine the state of the neutral grounding resistor 102.

The fault protection arrangement 100 includes a sense circuit 110 and signal generation circuit 120, acting together as a neutral grounding resistor monitor for the neutral grounding resistor 102. The signal generation circuit 120 may include injection signal generator 122, while the sense circuit includes capacitor 112. The injection signal generator 122 may operate at the kHz to GHz range in various non-limiting embodiments. Advantageously, the injection signal generator 122 may operate below approximately 1 MHz in some embodiments. In operation, a high frequency signal of any suitable waveform is sent by the injection signal generator 122 to the neutral grounding resistor 102 along an electrical path including the capacitor 112. The capacitor 112 may be sized to exhibit an appropriate capacitance and breakdown voltage according to the system to be protected. Particularly, the capacitor 112 may exhibit a capacitance of hundreds of picoFarads, nanoFarads, to hundreds of nanoFarads. By use of suitable capacitance for the capacitor 112 at an appropriate probe frequency, such as 300 kHz, small changes in impedance of the neutral ground resistor 102 may be ascertained, as detailed in the embodiments to follow.

In some embodiments, the repetition frequency of the injection signal generator 122 may range from 240 Hz to 10 MHz, while the edge rate range from 240 Hz to 10 GHz. In particular embodiments, the repetition rate may range from 100 kHz to 5 MHz, while the edge rate ranged from 100 kHz to 1 GHz. The signals generated by injection signal generator 122 may be used to probe resistance of a neutral grounding resistor in open state, short circuit state, or a changing value under normal operation. In addition, system inductance, NGR inductance, connection inductance, system capacitance, NGR capacitance, and connection capacitance may be probed by the signals.

As further shown in FIG. 1D, the signal generation circuit may further include an alarm circuit 124, to generate an alarm signal when the resistance of the neutral grounding resistor 102 falls outside of a predetermined range.

Figure 2A:
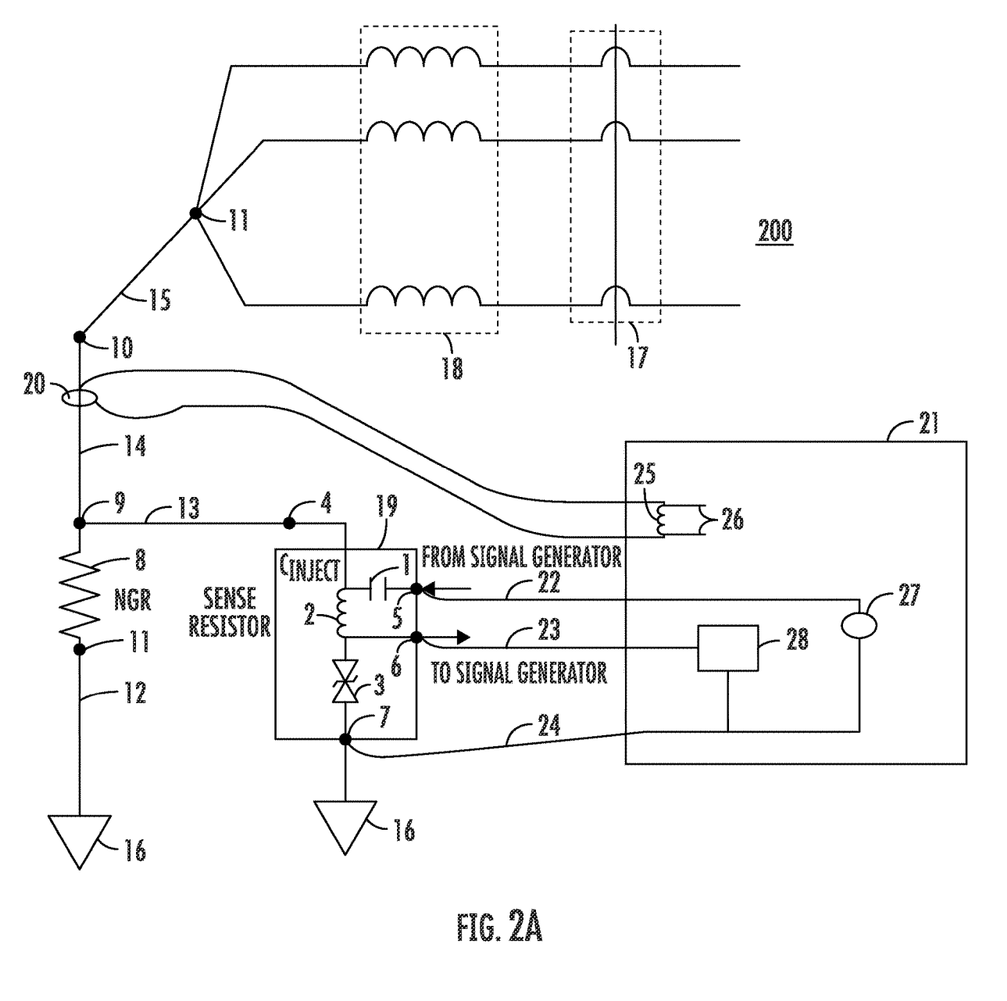
FIG. 2A shows another protection arrangement in accordance to additional embodiments of the disclosure.

FIG. 2A shows a protection arrangement 200 according to additional embodiments of the disclosure. A listing of components for certain figures to follow is provided in Table I.

TABLE I

Figure 2B:
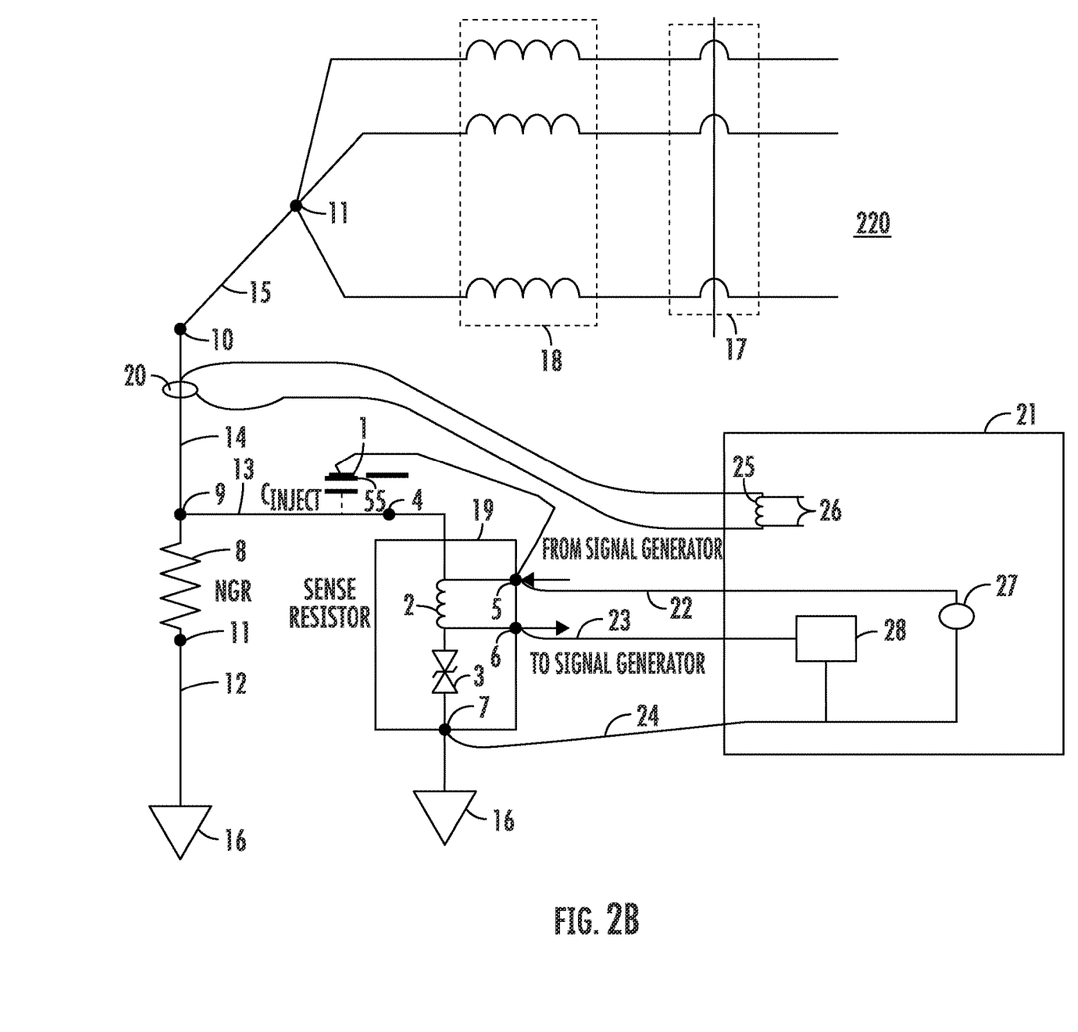
FIG. 2B shows another protection arrangement in accordance to additional embodiments of the disclosure.

| Item | Description |
| --- | --- |
| 1 | Injection Capacitor located near or in sensing resistor assembly |
| 2 | sensing resistor element |
| 3 | sensing resistor protection diode |
| 4 | Measurement connection point on sensing resistor |
| 5 | measurement input signal connection point on injection capacitor |
| 6 | analog sensing connection point on sensing resistor |
| 7 | protective earth connection point on sensing resistor |
| 8 | Neutral grounding resistor |
| 9 | Node or measurement connection point on NGR |
| 10 | node between wire 14 and wire 15 |
| 11 | NGR protective earth connection point |
| 12 | wire to protective earth |
| 13 | wire between sensing resistor connection point 4 and NGR connection point 9 |
| 14 | NGR intermediate wire |
| 15 | Neutralizing wire |
| 16 | protective earth connection |
| 17 | circuit breaker |
| 18 | transformer secondary |
| 19 | sensing resistor assembly |
| 20 | current transformer |
| 21 | NGR Monitor device |
| 22 | signal injection wire |
| 23 | NGR sense wire |
| 24 | protective earth sense wire |
| 25 | CT burden resistor |
| 26 | burden resistor measurement point |
| 27 | injection signal generator |
| 28 | signal processing |
| 29 | wire with a conductive outer wall wrapped around the exterior |
| 30 | wire element |
| 31 | wire insulation |
| 32a | conductive outer wrap |
| 32b | signal injection wire |
| 33 | wire element |
| 34 | physical capacitor |
| 35 | 2-layer pcb capacitor |

TABLE I-continued

| Item | Description |
|---|---|
| 36 | connection point on pcb capacitor |
| 37 | outer layer circuit board trace |
| 38 | circuit board dielectric |
| 39 | capacitance between plates |
| 40 | outer layer circuit board trace |
| 41 | connection point on 40 |
| 42 | multi-layer pcb capacitor |
| 43 | outer layer circuit board trace |
| 44 | inner layer circuit board trace |
| 45 | circuit board dielectric |
| 46 | inter-layer connection point |
| 47 | inter-layer connection transmission |
| 48 | inter-layer connection point |
| 49 | inner layer circuit board trace |
| 50 | outer layer circuit board trace |
| 51 | connection point on 50 |
| 52 | Connection point |
| 53 | Inner layer circuit board trace |
| 54 | Connector point |
| 55 | Alternate signal injection arrangement, this may be implemented at wire 13, 14 or 15. Each location can provide a different implementation |
| 56 | capacitance created between inner wire conductor and outer conductive wrap |
| 57 | outer conductive wrap |
| 58 | injection wire |
| 59 | PCB capacitor series/parallel connection element |
| 60 | PCB capacitor series/parallel connection element |
| 61 | pcb capacitor element |

Figure 3A:
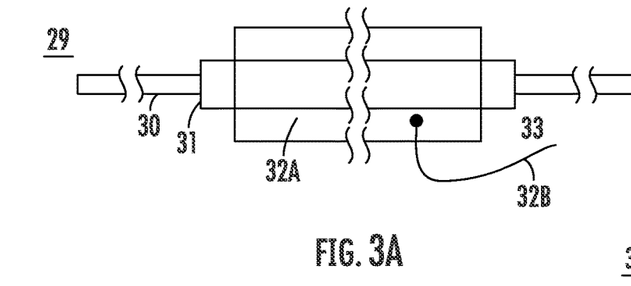
FIG. 3A presents one embodiment of a capacitor according to the present embodiments.
Figure 3B:
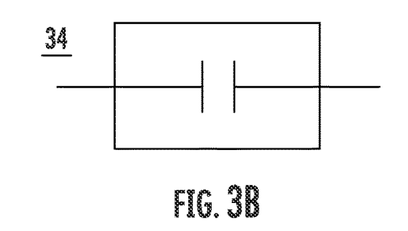
FIG. 3B presents another embodiment of a capacitor according to the present embodiments.
Figure 3C:
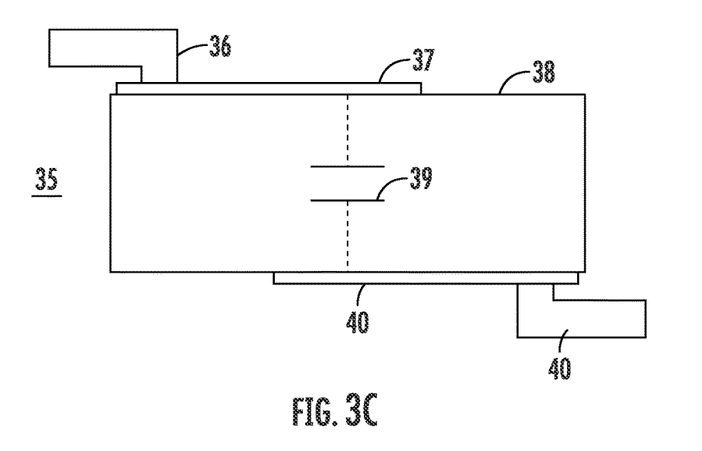
FIG. 3C presents a further embodiment of a capacitor according to the present embodiments.
Figure 3D:
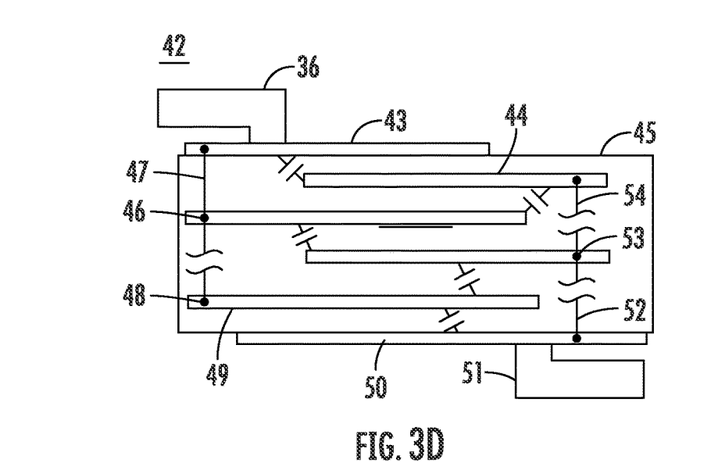
FIG. 3D presents an additional embodiment of a capacitor according to the present embodiments.
Figure 4:
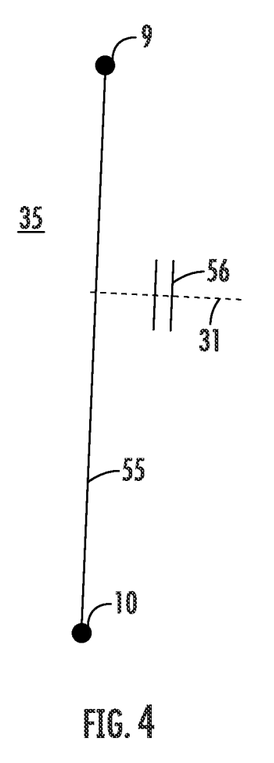
FIG. 4 depicts a capacitor arrangement, according to embodiments of the disclosure.
Figure 5:
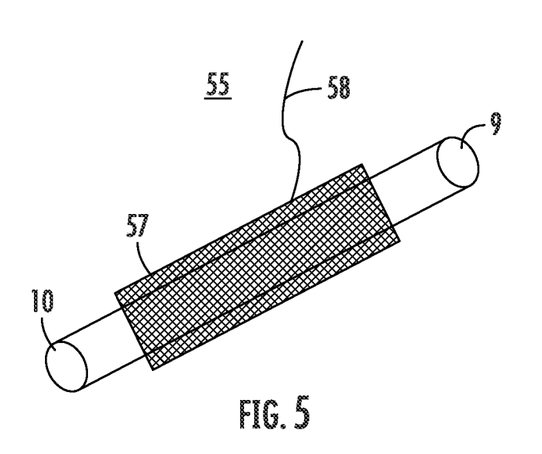
FIG. 5 presents a perspective view of an additional embodiment of a capacitor according to the present embodiments.
Figure 6:
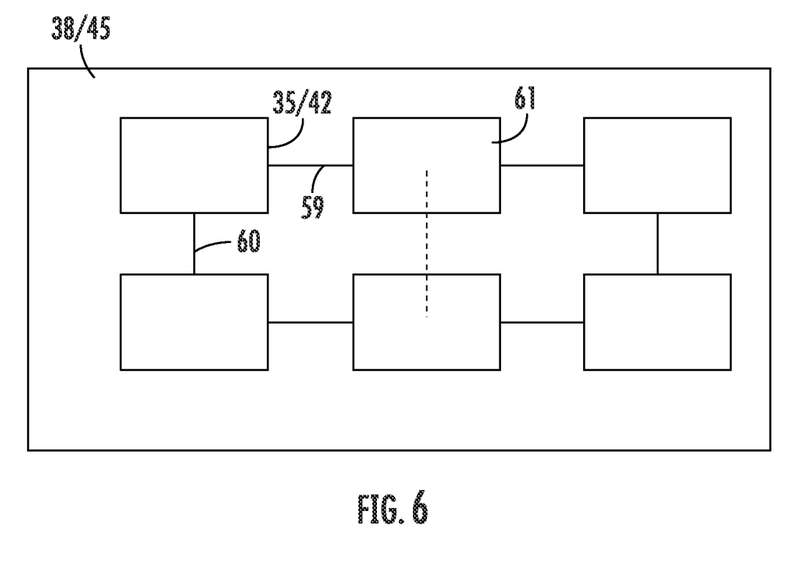
FIG. 6 shows a further capacitor arrangement, according to embodiments of the disclosure.
Figure 7A:
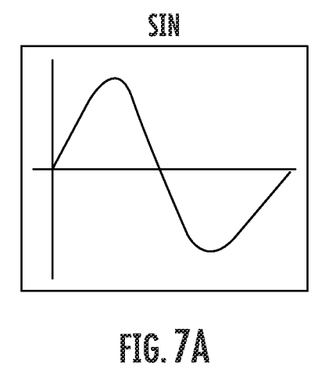
FIGS. 7A-7E depicts exemplary waveforms for implementing embodiments of the present disclosure.
Figure 7B:
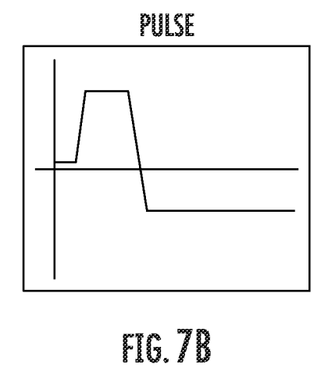
Figure 7C:
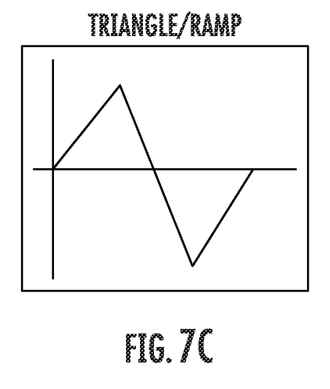
Figure 7D:
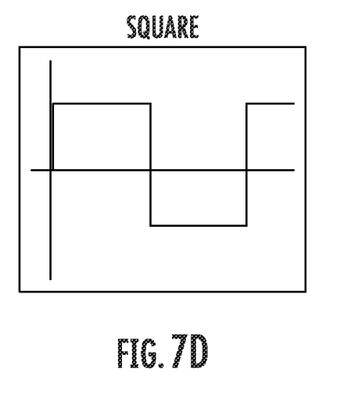
Figure 7E:
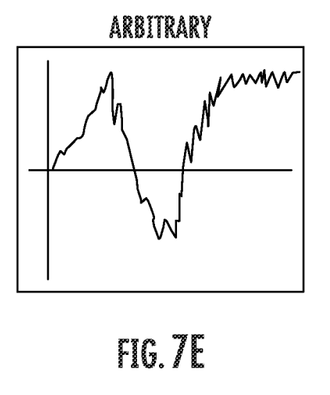

Key:
FIG. 2A, 2B- 1-28;
FIG. 3A: 29-33;
FIG. 3B: 34;
FIG. 3C: 35-41;
FIG. 3D: 42-54;
FIG. 4: 55-56;
FIG. 5: 57-58;
FIG. 6: 60-61

The protection arrangement 200 is shown in relation to a transformer, where the transformer secondary 18 is shown in three phases that are connected to NGR protective earth connection point 10. A neutral grounding resistor 8 is connected to a node 10 between wire 15 and wire 14, as may be the case in known arrangements. The current transformer 20 is used to sense current along the wire 14 with the aid of burden resistor measurement point 26, facilitating measurement of current at node 9 for the neutralizing ground resistor 8. In this embodiment a sense circuit is configured as a sensing resistor assembly 19, including a sensing resistor diode assembly 3, a sense resistor 2, and an injection capacitor 1, arranged in electrical series between the neutral grounding resistor 8 and an NGR monitor device 21. The NGR monitor device, in turn, includes a signal processing circuit 28, and injection signal generator 27, arranged to generate a high frequency signal through injection capacitor 1, such as kHz or MHz signal, or GHz signal. In one variant capacitor arrangement 55, shown in the protection arrangement 220 of FIG. 2B, the injection capacitor 1, may be located to directly connect to wire 13 (as shown), wire 14, or wire 15.

Figure 8:
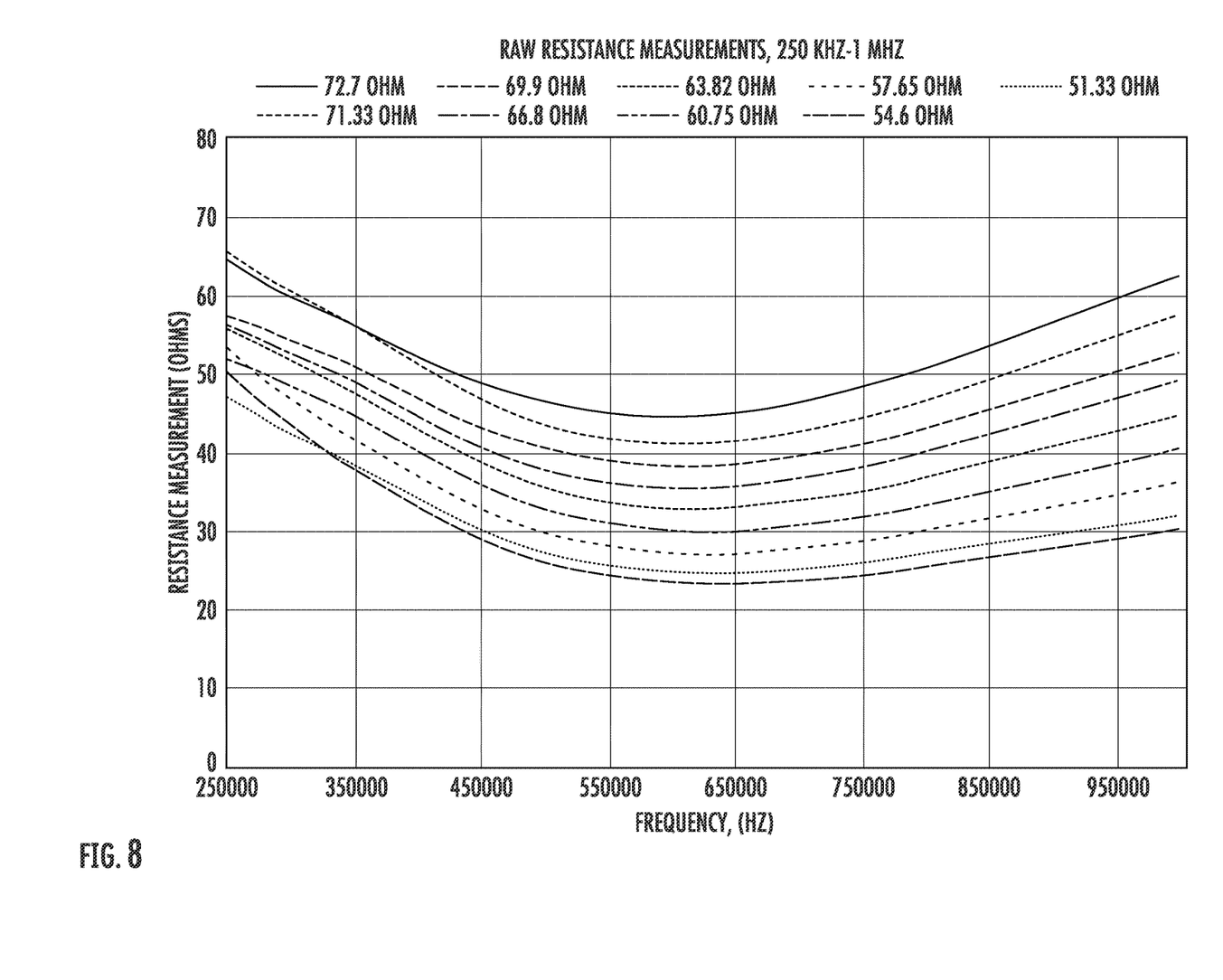
FIG. 8 depicts exemplary measurement results showing high frequency impedance measurements resulting from small changes in resistance in a grounding resistor.

In operation, the protection arrangement 200 may probe the resistance of neutral grounding resistor 8 intermittently, regularly, or upon request, by sending an injection signal from the injection signal generator 27. FIGS. 7A-7E depicts exemplary waveforms for implementing embodiments of the present disclosure. Suitable waveforms include sinusoidal shape, pulse shape, triangle shape, square wave shape, or arbitrary. The present inventors have determined that small changes in resistance of a neutral grounding resistor presenting resistance in the range of tens of Ohms may readily be measured using an arrangement generally as shown in FIG. 2, where the signal frequency is in the 100-kHz range. The embodiments are not limited in this context. FIG. 8 presents exemplary data for a resistor coupled to an injection capacitor having capacitance of 1 nF, showing impedance as a function of frequency. As such, resistance changes in the range of 1 Ohm may be readily detected during operation of a signal injector circuit in the 100 kHz to 1 MHz range. For neutral grounding resistors having a nominal resistance of 50 Ohm as an example, such resistance changes fall well below certain operation specifications, where the resistance is to be maintained within a 20% of nominal value.

In addition to modifying waveform shape, scanning an installation with a frequency sweep can determine optimal frequency and installation parasitic losses. Moreover, a search algorithm may be implemented to find optimal frequencies for the system installation. In accordance with various embodiments of the disclosure, an injection capacitor may be implemented in different configurations.

FIG. 3A presents one embodiment of a capacitor 29, embodied as wire with a conductive outer wall wrapped around the exterior according to the present embodiments. A wire element 30 is wrapped by wire insulation 31, and a conductive outer wrap 32A. A signal injection wire 32B connects to the conductive outer wrap 32A, with another wire element 33 on the other side of the conductive outer wrap 32A.

FIG. 3B presents another embodiment of a capacitor 34 according to the present embodiments. Here, the capacitor 34 may be a known capacitor, such as a parallel plate capacitor or any convenient "off the shelf" capacitor arranged with the appropriate capacitance.

FIG. 3C presents a further embodiment of a capacitor 35 according to the present embodiments. In this embodiment, the capacitor 35 is a two-layer printed circuit board (PCB) capacitor, arranged with a first connection point 36 and a second connection point 41. The printed circuit board may have a printed circuit board body composed of a known material, such as FR4. A first outer layer circuit board trace 37 is arranged on one side, while a second outer layer circuit board trace is arranged on the other side of the capacitor formed by a circuit board dielectric 38. The effective capacitance presented by the circuit board dielectric is represented by capacitor 39. To achieve a target capacitance, the area (in plan view of the capacitor 35) as well as the thickness (between outer layer circuit board traces) and dielectric permittivity of the circuit board dielectric may be adjusted independently of one another.

FIG. 3D presents an additional embodiment of a capacitor 42, according to the present embodiments. Here, the capacitor 42 is arranged as a multi-layer PCB capacitor, based upon a circuit board dielectric 45. An outer layer circuit board trace 43 is provided on the top of the capacitor, while an inner layer circuit board trace 44 is shown below the outer layer circuit board trace 43. Various additional inner layer circuit board traces and connection points are provided in the capacitor 42, as shown, and detailed in table I. The various traces may be formed of known metal layers, such as copper. Some of the traces may be electrically conductively connected to one another such as 43, 46, 49, while other traces are electrically conductively connected to one another, such as 54, 53, 50, using plated vias. As such, the coupled traces may form a capacitor whose area exceeds the planar area of the circuit board. For example, three traces that occupy the full area of the PCB may exhibit a capacitor area approximately 3 times the area of the PCB. Thus, the capacitor 42 provides a convenient configuration to generate high capacitance in a relatively smaller area.

FIG. 4 presents details of a capacitor arrangement 55, where the capacitor 56 represents a capacitance created between an inner wire conductor and outer conductive wrap, as detailed at FIG. 5. As shown, an injection wire 58 (coupled to a signal injector) is electrically connected to a wire wrap 57, disposed around a wire between nodes 9 and 10.

FIG. 6 shows a further capacitor arrangement, according to embodiments of the disclosure. In this arrangement, multiple capacitors may be built in each PCB, where capacitors are electrically connected to fulfill target properties, such as stand-off voltage, total capacitance, parasitic loss, reliability, and manufacturing limitations.

Figure 9:
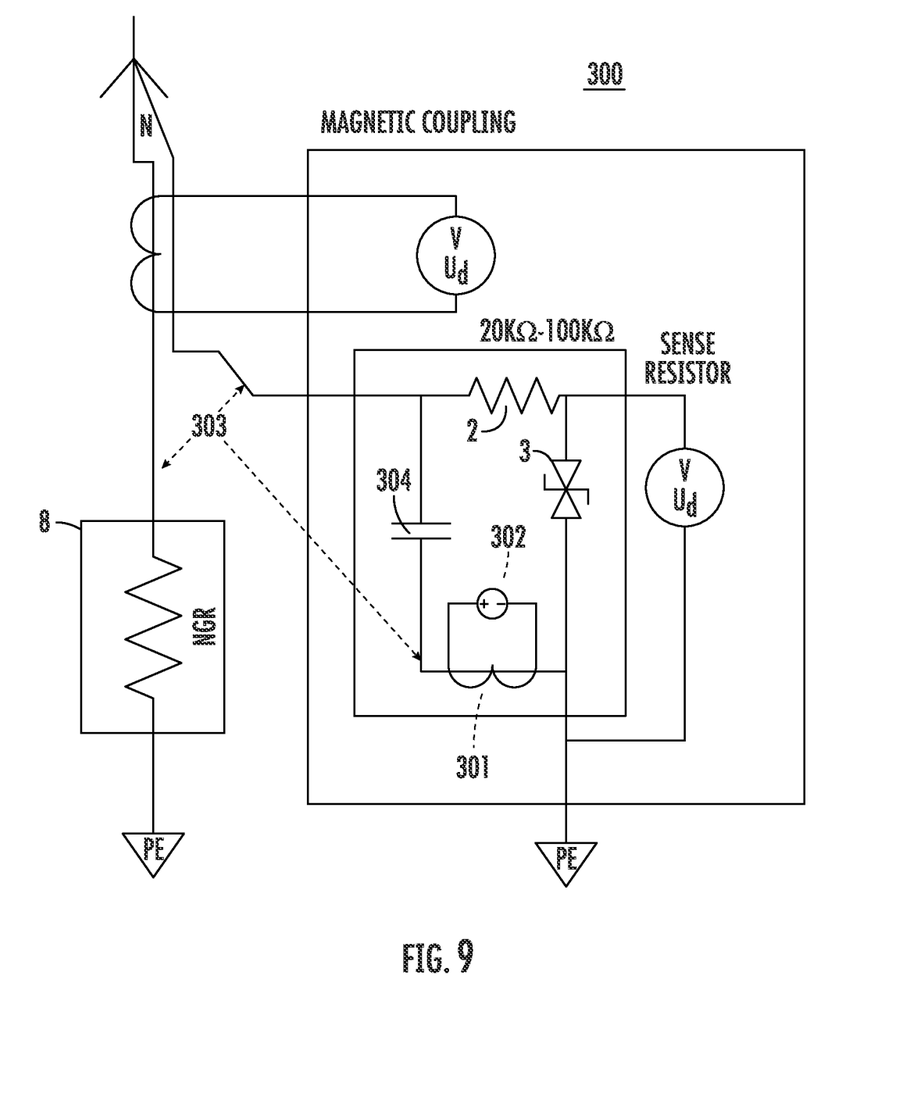
FIG. 9 depicts an exemplary protection arrangement, according to further embodiments of the disclosure.

FIG. 9 depicts a protection arrangement 300, according to further embodiments of the disclosure. The protection arrangement 300 involves capacitive coupling of an inspection signal to measure the resistance of neutral grounding resistor 8. The protection arrangement 300 includes a current transformer 301, capable of operating at the frequencies of interest, as well as a signal source 302, to excite a secondary end of the current transformer 301. In different embodiments, the current transformer 301 may be located at different locations in the protection arrangement 300, as indicated by reference number 303. The location of different voltage measurements (V Ud) is also shown. The protection arrangement 300 also includes a capacitor 304, which capacitor generates a high frequency path to complete the electrical circuit around the neutral grounding resistor 8. This arrangement provides greater isolation to the control electronics and if coupled directly across an NGR, provides even better measurement accuracy.

Figure 10:
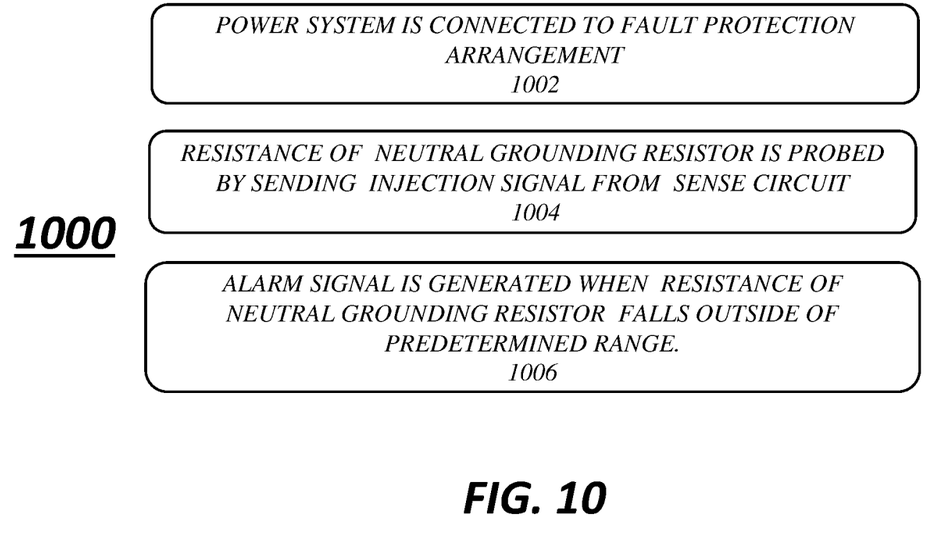
FIG. 10 depicts an exemplary process flow.

FIG. 10 depicts an exemplary process flow 1000. At 1002, a power system is connected to a fault protection arrangement. According to various embodiments, the fault protection arrangement may include a neutral grounding resistor, the neutral grounding resistor comprising a ground end and a non-ground end; a sense circuit, coupled to the non-ground end of the neutral grounding resistor, the sense circuit comprising a sense resistor, and an injection capacitor; and an injection signal generator, coupled to the non-ground end of the neutral grounding resistor. At block 1004, a resistance of the neutral grounding resistor is probed by sending an injection signal from the sense circuit. At block 1006, an alarm signal is generated when the resistance of the neutral grounding resistor falls outside of a predetermined range.

In sum, the present embodiments provide components, circuit arrangements and techniques to conveniently monitor small changes in resistance, such as in neutral grounding resistors. System implementations may be realized by injecting a high frequency signal through a neutralizing wire with a capacitor arranged such as in FIG. 5. Alternatively, an injecting capacitor may be collocated with sensing resistor in a sense circuit. In various embodiments, an injecting capacitor may be embodied in a PCB, including in a multilayer PCB having 4 layers, 6 layers, 8 layers, and so forth.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.

What is claimed is:

1. A fault protection arrangement, comprising:
a neutral grounding resistor, the neutral grounding resistor comprising a ground end and a non-ground end;
a neutral grounding resistance monitor assembly, comprising:
a sense circuit, coupled to the non-ground end of the neutral grounding resistor; and
an injection signal generator, coupled to the non-ground end of the neutral grounding resistor the injection signal generator arranged to generate a frequency of 240 Hz or greater; and
a capacitor, having a first electrode coupled to receive a signal from the injection signal generator, and a second electrode, coupled to the non-ground end of the neutral grounding resistor, wherein the capacitor comprises:
a printed circuit board body;
a first conductive trace, disposed on a first surface of the printed circuit board body, and covering a majority of the first surface; and
a second conductive trace, disposed one a second surface of the printed circuit board body, and covering a majority of the second surface, opposite the first surface.

2. The fault protection arrangement of claim 1, wherein the capacitor comprises:
a conductive wire, coupled to the non-ground end of the neutral grounding resistor; and
conductive wrap, concentrically disposed around the conductive wire, and coupled to receive a signal from the injection signal generator.

3. The fault protection arrangement of claim 1, wherein the capacitor comprises:
a third conductive trace, disposed within the printed circuit board body, and electrically conductively connected to the first conductive trace; and
a fourth conductive trace, disposed within the printed circuit board body, and electrically conductively connected to the second conductive trace,
wherein a capacitor area of the capacitor exceeds a planar area of the printed circuit board body.

4. The fault protection arrangement of claim 1, the injection signal generator arranged to generate a frequency of 1 MHz or less.

5. The fault protection arrangement of claim 1, the neutral grounding resistance monitor assembly further comprises a signal processing circuit, connected to the injection signal generator.

6. The fault protection arrangement of claim 1, the sense circuit comprising a sensing resistor diode assembly, a sense resistor, and an injection capacitor.

7. The fault protection arrangement of claim 1, the injection signal generator configured to generate a waveform having a shape chosen from one of: sinusoidal shape, pulse shape, triangle shape, square wave shape, or arbitrary shape.

8. The fault protection arrangement of claim 1, wherein the injection signal comprises a signal frequency in a100-kHz to 900 kHz range.

9. A neutral grounding resistor monitor assembly, comprising:
a sense resistor circuit, having an output, arranged to connect to a non-ground end of a neutral grounding resistor;
an injection signal generator, arranged to connect to the non-ground end of the neutral grounding resistor the injection signal generator arranged to generate an alternating current signal; and an injection capacitor, the injection capacitor comprising a first electrode coupled to receive a signal from the injection signal generator, and a second electrode, arranged to connect to the non-ground end of the neutral grounding resistor, wherein the injection capacitor comprises:

a printed circuit board body;

a first conductive trace, disposed on a first surface of the printed circuit board body, and covering a majority of the first surface; and a second conductive trace, disposed one a second surface of the printed circuit board body, and covering a majority of the second surface, opposite the first surface.

10. The neutral grounding resistor monitor assembly of claim 9, wherein the injection capacitor is included in the sense resistor circuit.

11. The neutral grounding resistor monitor assembly of claim 9, wherein the alternating current signal comprises a signal frequency in a 100 kHz to 900 kHz range.

12. The neutral grounding resistor monitor assembly of claim 9, wherein the injection capacitor comprises:

a conductive wire, coupled to the non-ground end of the neutral grounding resistor; and conductive wrap, concentrically disposed around the conductive wire, and coupled to receive a signal from the injection signal generator.

13. The neutral grounding resistor monitor assembly of claim 9, wherein the injection capacitor comprises:

a third conductive trace, disposed within the printed circuit board body, and electrically conductively connected to the first conductive trace; and a fourth conductive trace, disposed within the printed circuit board body, and electrically conductively connected to the second conductive trace, wherein a capacitor area of the capacitor exceeds a planar area of the printed circuit board body.

14. The neutral grounding resistor monitor assembly of claim 9, wherein the neutral grounding resistor monitor comprises an alarm circuit, to generate an alarm signal when the resistance of the neutral grounding resistor falls outside of a predetermined range.

15. A fault protection method, comprising:

connecting a power system to a fault protection arrangement, the fault protection arrangement comprising:

a neutral grounding resistor, the neutral grounding resistor comprising a ground end and a non-ground end; and a neutral grounding resistor monitor assembly, comprising:

a sense circuit, coupled to the non-ground end of the neutral grounding resistor, the sense circuit comprising a sense resistor, and an injection capacitor; and an injection signal generator, coupled to the non-ground end of the neutral grounding resistor; and probing a resistance of the neutral grounding resistor by sending an injection signal from the sense circuit;

wherein a frequency of the injection signal ranges from 240 Hz to 10 MHz, and wherein an edge rate of the injection signal ranges from 240 Hz to 10 GHz.

16. The method of claim 15, wherein the injection signal comprises a waveform having a shape chosen from one of: sinusoidal shape, pulse shape, triangle shape, square wave shape, or arbitrary shape.

* * * * *